United States Patent [19]

Schroeder

[11] Patent Number: 4,933,741
[45] Date of Patent: Jun. 12, 1990

[54] MULTIFUNCTION GROUND PLANE
[75] Inventor: Jack A. Schroeder, Scottsdale, Ariz.
[73] Assignee: Motorola, Inc., Schaumburg, Ill.
[21] Appl. No.: 270,187
[22] Filed: Nov. 14, 1988
[51] Int. Cl.⁵ ............................................. H01L 23/48
[52] U.S. Cl. ................................... 357/70; 174/52.4; 361/410
[58] Field of Search ............................ 357/70, 68, 84; 361/410, 414, 421; 174/52.4

[56] References Cited
U.S. PATENT DOCUMENTS 4,410,906 10/1983 Grabbe .................................. 357/68
4,811,082 3/1989 Jacobs et al. ........................ 357/80

Primary Examiner—James W. Davie
Attorney, Agent, or Firm—Charles R. Lewis

[57] ABSTRACT

A multifunction ground plane for an electrical device such as an integrated circuit is provided by a plurality of conductors each having one end thereof adapted to be coupled to the electrical device with a ground plane adjacent and electrically isolated from said plurality of conductors. The ground plane includes a plurality of electrically isolated portions each of which can be coupled to the electrical device to provide operating potential and/or signals thereto or therefrom. The isolated ground plane portions have an impedance less than that of the electrical conductors and provide an alternate means for connecting operating potential(s) and/or operating signals to and from the electrical device while still functioning as a ground plane for the electrical conductors.

12 Claims, 1 Drawing Sheet

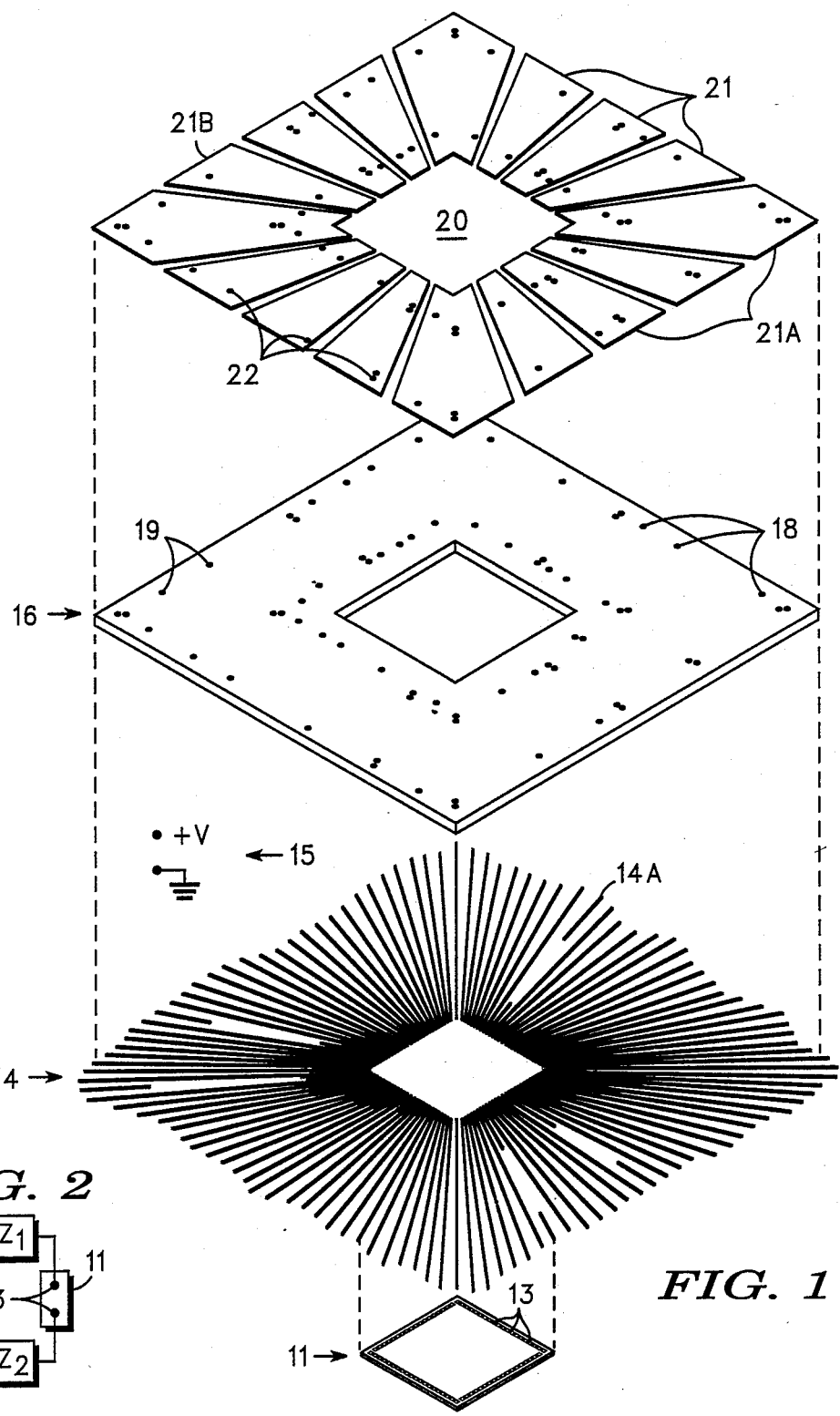
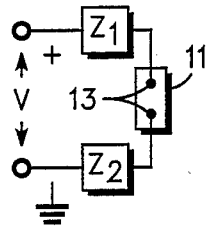
FIG. 2
FIG. 1

MULTIFUNCTION GROUND PLANE

BACKGROUND OF THE INVENTION

This invention relates to a ground plane for a plurality of associated electrical conductors with the ground plane comprising a plurality of isolated segments to provide alternate conductors having a lower impedance than the associated plurality of conductors. More specifically, the present invention relates to a ground plane for a plurality of conductors coupled to an electrical device such as an integrated circuit, wherein the ground plane contains a plurality of isolated portions that provide lower impedance conductive paths to the integrated circuit.

As the complexity of electrical devices such as integrated circuits increase, while the size of the components thereon correspondingly decreases, the number of electrical conductors or leads connected or coupled to the integrated circuit to enable operation of the integrated circuit increase in number and correspondingly decrease in size. For example, at this time it is very common that an integrated circuit will have hundreds of conductors or leads connected thereto and typically these are no more than about one-half mil thick, about two mils in width, with about two mils spacing therebetween. These small conductors have a considerable impedance such that a significant voltage drop takes place along the length of the conductors that supply operating power to the integrated circuit. Further, variations of the DC operating current creates switching noise due to the high impedance of these conductors. Additionally, the capacitive coupling between these conductors causes cross talk on the signal lines going to and from the integrated circuit. Heretofore in the prior art a ground plane associated with the plurality of conductors has been used to reduce the capacitive coupling between the conductors to reduce cross talk on the signal lines. This ground plane has also been used as a conductor for one side of the DC supply used to power the integrated circuit.

SUMMARY OF THE INVENTION

A multifunction ground plane in accordance with the present invention is obtained by a ground plane associated with a plurality of conductors and comprises a plurality of electrically isolated segments or portions. The plurality of conductors are connected or coupled at one end thereof to an electrical device such as an integrated circuit. By selectively electrically connecting certain ones of the conductors to selected ones of the isolated portions of the ground plane, lower impedance paths are provided for applying operating power to the integrated circuit as well as providing lower impedance paths for applying signals to or obtaining signals from the integrated circuit. In addition to providing lower impedance paths to and from the integrated circuit, the segmented ground plane also performs the function of a ground plane for the plurality of associated electrical conductors.

BRIEF DESCRIPTION OF THE DRAWING

FIG. 1 is an exploded isometric view of a ground plane electrical conductor assembly in accordance with the present invention; and FIG. 2 is a logic representation of impedance paths provided by the ground plane-conductor assembly of the present invention.

DETAILED DESCRIPTION OF THE INVENTION

Referring now to FIG. 1, there is shown an electrical device such as an integrated circuit 11. The integrated circuit 11 is generally a planar device having a plurality of connector pads 13 around the periphery thereof which allow operating power 15 to be applied thereto and to allow operating signals to be applied to and obtained from the integrated circuit 11 Surrounding the integrated circuit 11 are a plurality of electrical conductors 14. The ends of the conductors 14 adjacent the integrated circuit 11 are coupled to the pads 13 by any number of well known means. For example, the ends of the conductors 14 may be directly connected to the pads 13 by means of temperature and/or pressure in accordance with any number of well known processes. Additionally, the ends of the conductors 14 may be coupled to the pads 13 by way of thin wires (not shown) in accordance with well known techniques. The ends of the conductors 14 remote from the integrated circuit 11 may extend to a metallic leadframe (not shown), may extend to and be part of a tape automated bonding (TAB) assembly, may extend to and be part of a well known pin grid array (PGA) assembly, may be part of a multichip assembly, or any number of other well known connector and/or packaging techniques for electrically coupling to an integrated circuit. Because of the small physical size of the electrical conductors 14, they represent a significant impedance to operating potential and current 15 applied to the integrated circuit 11 causing an undesirable voltage drop along the length of the conductors 14. Additionally, capacitive coupling between the conductors 14 causes cross talk on the conductors 14 which apply signals to and/or derive signals from the integrated circuit 11. Further, the impedance of the conductors 14 create switching noise when the DC operating current 15 applied to the integrated circuit 11 varies.

The capacitive cross coupling between the conductors 14 can be reduced by a ground plane 20 which also surrounds the integrated circuit 11 and is located adjacent the plurality of conductors 14. Heretofore in the prior art this ground plane 20 was a unitary piece of electrically conductive material. This ground plane 20 reduced cross talk on the electrical conductors 14 used for signal lines and also sometime served as a return for one of the terminals of the operating potential 15 applied to the integrated circuit 11.

In accordance with the present invention the ground plane 20 is comprised of a plurality of electrically isolated portions 21. These isolated portions 21 have a portion thereof adjacent the integrated circuit 11 and another portion that extends outward away from the integrated circuit in a manner similar to that of the electrical conductors 14. The thickness of the ground plane 20 may be substantially the same as the thickness of the electrical conductors 14. However, the width of the isolated portions 21 of the ground plane 20 is considerably greater than the electrical conductors 14 thereby providing a much lower electrical impedance than do the electrical conductors 14.

The segmented ground plane 20 is electrically isolated from and maintained substantially in parallel with the conductors 14 by means of an insulating layer 16 which may comprise any suitable material such as polyimide. The insulating material has selectively placed vias 18 thereon which are filled or plated with an electrically conductive material 19 such as copper. Each end of the resulting copper conductor 19 on opposite sides of the insulator 16 is connected to selected ones of the isolated ground plane portions 21 and selected electrical conductors 14. This is done in accordance with any number of well known processes where pressure and/or temperature is applied to the conductors 14 and the ground plane 20 to create a good electrical connection between them and the conducting material 19 in the vias 18. An alternate method of connecting selected ground plane portions 21 to selected conductors 14 would be by using plated through hole techniques well known in the circuit board industry.

For purposes of illustration only, the approximate point of contact of the conductor 19 in the vias 18 with the ground plane portions 21 is shown by dots 22 on the ground plane portions 21. As will be apparent to those skilled in the art, the dots 22 do not physically exist on the ground plane 20 isolated segments 21.

Even though FIG. 1 shows the assembly in an exploded view, the ground plane 20, insulating material 16 and electrical conductors 14 form a thin laminate having a thickness determined by the thickness of the conductors 14, insulating material 16, and ground plane 20 segments 21. Once connected to the conductors 14 by way of the pads 13 the integrated circuit 11 can be protected by a suitable covering or coating in accordance with the package in which it is to be utilized. For example, the integrated circuit 11 and associated conductors 14 and segmented ground plane 20 may be packaged in accordance with well known TAB, PGA, plastic encapsulation or other techniques. When the integrated circuit 11 is plastic encapsulated, an option is to also completely enclose and encapsulate the surrounding segmented ground plane 20 and underlying electrical conductors 14.

In accordance with the present invention the electrical conducting material 19 in the vias 18 can be utilized to electrically connect a ground plane segment at its portion adjacent the semiconductor die to an underlying electrical conductor 14. In a similar manner the end of the isolated ground plane 20 portion 21 removed from or remote from the integrated circuit 11 is coupled to the same conductor 14 thereby providing a path to the integrated circuit 11 that includes the conductor 14 in parallel with the ground plane segment 21 to which it is connected (see ground plane segment 21B). Alternatively, the electrical conductor 14 may be discontinued intermediate the two vias 18 that connect it to the isolated ground plane 21 portion such that the path to the integrated circuit 11 is made by way of the isolated ground plane portion 21 (see conductor 14A). In a like manner more than one, i.e. a plurality of the conductors 14, may be connected to the same ground plane portion 21 when the current carrying capacity of a single conductor 14 is insufficient to provide reliable connection to the ground plane portion 21 (see ground plane portion 21A). Further, a ground plane portion 21 can be connected at one or both ends thereof to an underlying conductor 14 by way of two or more vias 18 (see ground plane 21A). As will now be apparent, access to the integrated circuit 11 for operating potential and current, signals applied thereto, signals derived therefrom, etc. can be provided by way of any combination of the conductors 14, conductors 14 in parallel with isolated segments 21 of the ground plane 20, or just various segments 21 of the ground plane 20.

Reference to FIG. 2 shows connection to two pads 13 on the integrated circuit 11. One connection to the integrated circuit 11 has the impedance Z1 while the other connection to the integrated circuit has the impedance Z2. If the connection to the integrated circuit is by way of the conductors 14 Z1 and Z2 will be a relatively high impedance. However, this impedance can be reduced significantly if connection to the integrated circuit 11 is made by way of one of the isolated ground plane 20 portions 21. Accordingly, by applying operating potential or current 15 to the integrated circuit 11 by way of the isolated ground plane portions 21, the impedance thereto is reduced substantially thereby reducing the resulting voltage drop thereacross and also decreasing switching noise caused by any variation in the operating current 15. Also, use of the ground plane portions 21 to provide signals to the integrated circuit 11 and to derive signals from the integrated circuit 11 provides low impedance paths for such signals. This is particularly important with regard to smart power devices wherein the output signal contains a substantial amount of current.

As is now apparent, the isolated ground plane portions 21 being selectively electrically connectable to the electrical conductors 14 enable various combinations thereof to access or derive information or signals from the integrated circuit 11 by way of low impedance paths. In addition to providing low impedance to and from the integrated circuit 11 the isolated ground plane portions 21 taken together constitute a ground plane 20 for the plurality of conductors 14. This reduces the cross coupling capacitance between the conductors 14 with a resulting reduction in the cross talk between the conductors 14 which carry signals to or from the integrated circuit 11. Alternatively, the portion of a ground plane 21 adjacent the integrated circuit 11 may be connected directly to a pad 13 instead of by way of a conductor 14.

Various changes and modifications of this invention as described will be apparent to those skilled in the art without departing from the spirit and scope of this invention as defined by the following claims.

I claim:

1. A multiconductor ground plane for an electrical device having a plurality of connecting pads thereon to enable operation of said electrical device comprising:
   a plurality of conductors each having one end thereof coupled to at least one of said pads, and
   a ground plane for said plurality of conductors,
   said ground plane including a plurality of electrically isolated portions,
   at least one of said isolated ground plane portions coupled to at least one of said pads to function as a conductor;
   said ground plane portion conductors having an impedance lower than that of said plurality of conductors.

2. The ground plane according to claim 1 further comprising:
   at least one electrical connection between at least one of said plurality of conductors and at least one of said ground plane portions to enable selected ones of said ground plane portions to be electrically coupled to selected ones of said pads.

3. The ground plane according to claim 1 further comprising:

an electrically insulating material located between said ground plane and said plurality of conductors to provide electrical isolation and substantially uniform spacing between said ground plane and said plurality of conductors.

4. The ground plane according to claim 3 further comprising:

electrical connections passing through said insulating material and connecting at least one of said ground plane portions at opposite ends thereof with at least one of said conductors to enable selected ones of said ground plane portions to be electrically coupled to selected ones of said pads.

5. The ground plane according to claim 1 wherein a said ground plane portion is electrically coupled to at least one pad on said electrical device which is to receive a potential to operate said device with said ground plane portion adapted to be coupled to a source of said operating potential.

6. The ground plane according to claim 1 wherein a said ground plane portion is electrically coupled to at least one pad on said electrical device which is to provide an output from said electrical device.

7. A multiconductor ground plane assembly comprising:

a semiconductor device having a plurality of connecting pads thereon to enable operation of said semiconductor device, a plurality of conductors having one end adjacent said semiconductor device with said one end electrically coupled to at least one said pad, and a ground plane located substantially parallel to and electrically isolated from said plurality of conductors and functioning as a ground plane for said plurality of conductors, said ground plane including a plurality of electrically isolated portions with at least some of said electrically isolated portions having an area thereof adjacent to said semiconductor device;

at least one of said isolated ground plate portions electrically coupled to at least one of said pads to function as an electrical conductor to or from said semiconductor device;

said ground plane portion conductors having an impedance which is less than the impedance of any of said plurality of conductors.

8. The assembly according to claim 7 wherein said plurality of electrical conductors and said ground plane portions enable operating potential and/or signals to be applied to said semiconductor device and semiconductor device output(s) to be derived therefrom.

9. The assembly according to claim 7 wherein including an insulating material located between said ground plane and said plurality of conductors to provide electrical isolation and substantially uniform spacing therebetween.

10. The assembly according to claim 7 further including electrical connections between selected ones of said ground plane portions and selected ones of said ground plane portions to selected ones of said pads.

11. The assembly according to claim 7 wherein operating potential is applied to said semiconductor device by way of said isolated ground plane portions.

12. The assembly according to claim 7 wherein an output(s) from said semiconductor device is derived therefrom by way of selected ones of said ground plane portions.

* * * * *

UNITED STATES PATENT AND TRADEMARK OFFICE
CERTIFICATE OF CORRECTION

PATENT NO. : 4,933,741

DATED : June 12, 1990

INVENTOR(S) : Jack A. Schroeder

It is certified that error appears in the above-identified patent and that said Letters Patent is hereby corrected as shown below:

Column 6, line 19, delete "wherein" and insert --further--.

Column 6, line 26, after "said" insert --conductors to electrically couple selected ones of said--.

Signed and Sealed this

Eleventh Day of June, 1991

Attest:

HARRY F. MANBECK, JR.

*Attesting Officer*  *Commissioner of Patents and Trademarks*